US011495562B2

(12) United States Patent
MacDougal et al.

(10) Patent No.: US 11,495,562 B2
(45) Date of Patent: Nov. 8, 2022

(54) ALIGNMENT FEATURES FOR HYBRIDIZED IMAGE SENSOR

(71) Applicant: Attollo Engineering, LLC, Camarillo, CA (US)

(72) Inventors: Michael MacDougal, Camarillo, CA (US); Andrew Hood, Ventura, CA (US)

(73) Assignee: Attollo Engineering, LLC, Camarillo, CA (US)

( * ) Notice: Subject to any disclaimer, the term of this patent is extended or adjusted under 35 U.S.C. 154(b) by 0 days.

(21) Appl. No.: 16/728,443

(22) Filed: Dec. 27, 2019

(65) Prior Publication Data

US 2021/0202420 A1 Jul. 1, 2021

(51) Int. Cl.
*H01L 27/146* (2006.01)
*H01L 23/00* (2006.01)
*H01L 31/0203* (2014.01)

(52) U.S. Cl.
CPC ........ *H01L 24/13* (2013.01); *H01L 27/14618* (2013.01); *H01L 27/14636* (2013.01); *H01L 31/0203* (2013.01); *H01L 2924/01049* (2013.01); *H01L 2924/14* (2013.01)

(58) Field of Classification Search
CPC . H01L 27/14634; H01L 27/146; H01L 24/13; H01L 2225/06593; H01L 24/70; H01L 24/68; H01L 24/69
See application file for complete search history.

(56) References Cited

U.S. PATENT DOCUMENTS

| 5,523,628 | A | * | 6/1996 | Williams | H01L 23/562 257/777 |
| 6,441,497 | B1 | * | 8/2002 | Han | H01L 24/81 257/777 |
| 2002/0030285 | A1 | * | 3/2002 | Sawada | H01L 25/50 257/782 |
| 2010/0079631 | A1 | * | 4/2010 | Mitra | H01L 27/14694 348/294 |
| 2011/0215466 | A1 | * | 9/2011 | Hsu | H01L 24/81 257/737 |

(Continued)

FOREIGN PATENT DOCUMENTS

JP 2013004715 A 1/2013

OTHER PUBLICATIONS

Lee, et al., "Fine Keyed Alignment and Bonding for Wafer-Level 3D ICs", Mater. Res. Soc. Symp. Proc. vol. 914 2006 Materials Research Society.

(Continued)

*Primary Examiner* — Sarah K Salerno
(74) *Attorney, Agent, or Firm* — Billion & Armitage

(57) ABSTRACT

A hybridized image sensor includes a first die and a second die. The first die includes a first surface, a first plurality of conductive bumps fabricated on the first surface, and a first alignment feature fabricated on the first surface. The second die includes a second surface, a second plurality of conductive bumps fabricated on the second surface, and second alignment features fabricated on the second surface, wherein the first alignment features interact with the second alignment features to align the first plurality of conductive bumps with the second plurality of conductive bumps.

16 Claims, 11 Drawing Sheets

(56) References Cited

U.S. PATENT DOCUMENTS

| | | | | |
|---|---|---|---|---|
| 2011/0275466 | A1* | 11/2011 | Rask | F16H 3/728 |
| | | | | 475/5 |
| 2012/0032321 | A1* | 2/2012 | West | H01L 23/49816 |
| | | | | 257/737 |
| 2013/0292037 | A1* | 11/2013 | Baskaran | H01L 23/10 |
| | | | | 156/91 |
| 2014/0252604 | A1* | 9/2014 | Motoyoshi | H01L 23/49816 |
| | | | | 257/737 |
| 2016/0043268 | A1* | 2/2016 | Bai | H01L 31/1876 |
| | | | | 257/432 |
| 2016/0071897 | A1 | 3/2016 | Tsukimura | |
| 2019/0244924 | A1* | 8/2019 | Zhang | H01L 24/11 |
| 2020/0357767 | A1* | 11/2020 | Sato | H01L 24/08 |
| 2020/0411463 | A1* | 12/2020 | Ettenberg | H01L 24/13 |

OTHER PUBLICATIONS

Lee, et al., "Wafer-to-Wafer Alignment for Three-Dimensional Integration: A Review", Journal of Microelectromechanical Systems, vol. 20, No. 4, Aug. 2011.

Marentis, et al., "Elastic Averaging for Assembly of Three-Dimensional Constructs From Elastomeric Micromolded Layers", Microelectromechanical Systems, Journal of 18.3 (2009): 531-538 2009 IEEE.

Slocum, et al., "Precision Passive Mechanical Alignment of Wafers", Journal of Microelectromechanical Systems, vol. 12, No. 6, Dec. 2003.

Extended European Search Report for EP Application No. 20209893. 5, dated May 4, 2021, 11 pages.

* cited by examiner

ALIGNMENT FEATURES FOR HYBRIDIZED IMAGE SENSOR

FIELD

This disclosure is directed generally to image sensors and, more specifically to alignment features utilized to fabricate hybridized image sensors.

BACKGROUND

Performance of imaging applications is based—at least in part—on the number and/or resolution of the pixels and field of view (FOV) of the imaging system. Because the pixel size drives the size of the lens and other components in the optical train, it is desirable to decrease the pixel size. For example, in visible imaging systems, the pixel sizes range from 1-4 microns, and the accompanying lenses are small as well; typically on the order of 0.5 to 2 $cm^3$. However, in infrared image applications the pixel size ranges from 10-25 microns, which can increase the size of the lens significantly.

An infrared image sensor is typically comprised of a photon detector die and a readout integrated circuit. The photon detector die is comprised of an array of pixels, each pixel configured to generate an electrical signal (i.e., voltage, current, resistance) in response to detected photons. The photon detector die includes a plurality of conductive bumps, each bump associated with one detection pixel. The plurality of conductive bumps on the photon detector die are aligned with a plurality of bumps located on the ROIC and the two are pressed together to form a bond between each of the aligned conductive bumps. In this way, electrical signals generated by each of the plurality of pixels are communicated to the ROIC die via the bonded conductive bumps. This process is known as hybridization, as the semiconductor material utilized to fabricate the photon detector die is typically different than the semiconductor material utilized to fabricate the ROIC die.

Pre-bonding alignment of the respective dies is typically fairly accurate (e.g., within approximately 1 um). However, the pre-bond alignment is lost during bonding, wherein the force applied causes the conductive bumps to slip relative to one another, resulting in a post-bond alignment that is less accurate than the pre-bond alignment. It would therefore be beneficial to maintain alignment during the hybridization process.

SUMMARY

According to some aspects, a hybridized image sensor is comprised of a first die having a first surface and a second die having a second surface. The first die includes a first plurality of conductive bumps fabricated on the first surface and a first alignment feature fabricated on the first surface. The second die includes a second plurality of conductive bumps fabricated on the second surface and second alignment features fabricated on the second surface, wherein the first alignment features interact with the second alignment features to align the first plurality of conductive bumps with the second plurality of conductive bumps.

According to another aspect, a method of fabricating a hybridized image sensor includes depositing a first plurality of conductive bumps on a first surface of a first wafer and depositing first alignment features on the first surface of the first wafer. The method may further include depositing a second plurality of conductive bumps on a second surface of a second wafer and depositing second alignment features on the second surface of the second wafer. The first wafer may then be diced into a plurality of first dies, wherein each first die includes a portion of the first plurality of conductive bumps and a portion of the first alignment features. Likewise, the photon detector wafer is diced into a plurality of photon detector dies, wherein each photon detector includes a portion of the second plurality of conductive bumps and a portion of the second alignment features. The first surface of a ROIC die is aligned with the second surface of a photon detector die, wherein the first alignment features are brought into contact with the second alignment features. The ROIC die and the photon detector die are pressed together, wherein the first alignment features and the second alignment features interact with one another to align the first plurality of conductive bumps with the second plurality of conductive bumps, wherein the first plurality of conductive bumps are bonded with the second plurality of conductive bumps.

DETAILED DESCRIPTION

According to some aspects, the present disclosure describes utilization of alignment features located on both the photon detector die and the readout integrated circuit (ROIC) die. The alignment features are configured to interlock with one another during bonding, wherein the interlocking of the features ensures alignment between the plurality of conductive bumps located on the photon detector die and the ROIC die. The interlocking alignment features reduce slip between the respective dies during bonding and also reduce the pre-bonding alignment requirements. In some embodiments, the interlocking features and the conductive bumps are fabricated as part of the wafer fabrication process, wherein hybridized sensors are assembled following dicing of the wafers into individual dies.

Figure 1:
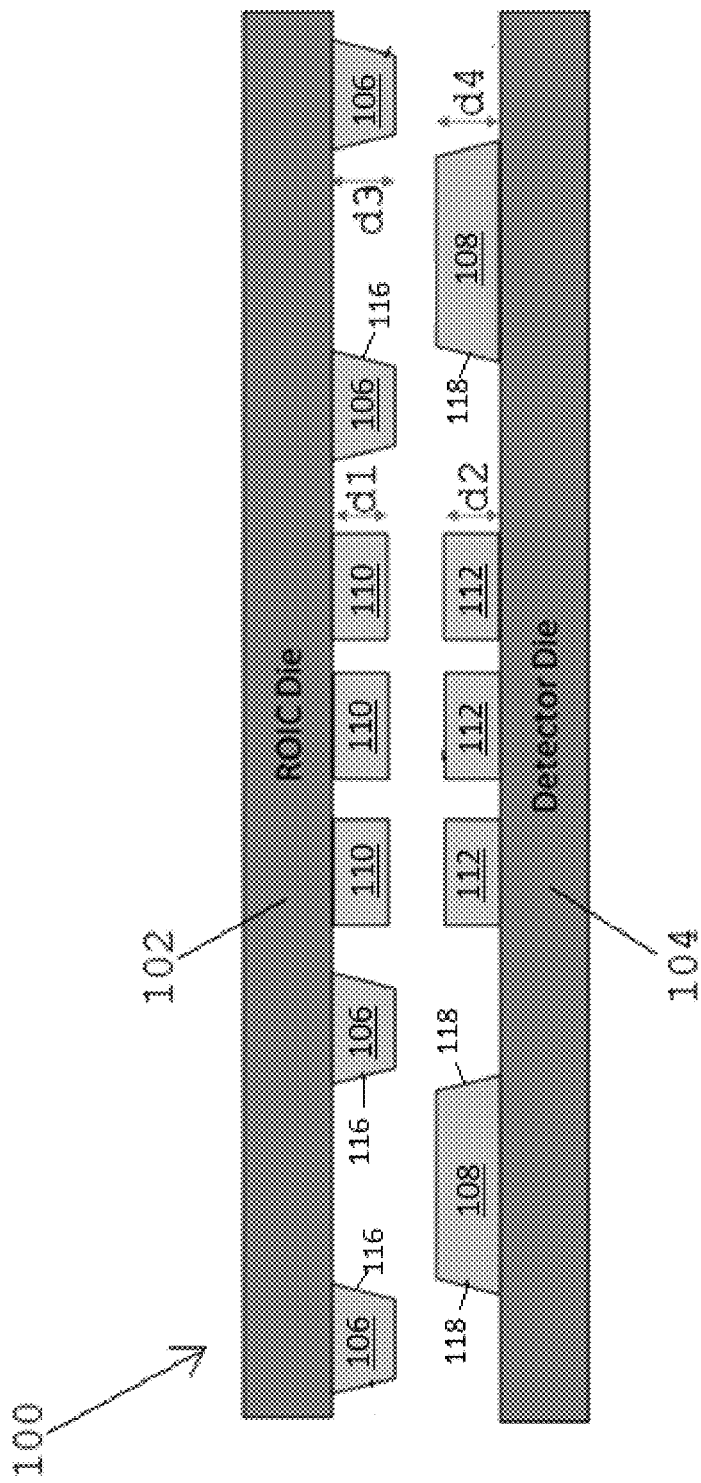
FIG. 1 is a schematic side view of a hybridized image sensor die that includes a silicon readout integrated circuit (ROIC) die and a detector die according to some embodiments.

FIG. 1 is a schematic side view of a hybridized image sensor 100 that includes a silicon readout integrated circuit (ROIC) die 102 and a photon detector die 104 prior to bonding. The ROIC die 102 includes a plurality of conductive bumps 110 and alignment features 106. The photon detector die 104 includes a plurality of conductive bumps 112 and alignment features 108. The plurality of conductive bumps 110 and 112 are comprised of a conductive material. In some embodiments, the plurality of conductive bumps 110 and 112 are comprised of a material—such as Iridium—that allows the conductive bumps 110 and 112 to be bonded at approximately room temperature. In other embodiments, the conductive bumps 110 and 112 may be comprised of other conductive materials, such as gold (Au), copper (Cu), silver (Ag), silver/nickel, etc. but these materials require a higher temperature for metallurgical bonding. In applications in which the photon detector die 104 and ROIC die 102 are dissimilar (e.g., type III-v semiconductor versus silicon substrate) and therefore have different coefficients of thermal expansion, a lower bonding temperature is beneficial. No electrical connection is required between the alignment features 106 and 108 and no metallurgical bonding is required between the features allowing a variety of materials to be utilized. For example, in some embodiments the alignment features 106, 108 may be fabricated utilizing a dielectric material. In other embodiments, the alignment features 106, 108 are fabricated from a conductive material (e.g., gold (Au), silver (Ag), Indium (In), or other well-known conductive materials). In yet other embodiments, the alignment features 106, 108 are fabricated from polymeric materials (e.g. polyimide, BCB, photoresist, or other well-known organic materials). In some embodiments the alignment features 106 and 108 are fabricated utilizing the same material. In other embodiments, the alignment features 106 and 108 are fabricated using different materials.

The plurality of alignment features 106 and 108 may be comprised of the same or different material as that utilized for the plurality of conductive bumps 110 and 112. For example, the plurality of alignment features 106 and 108 may be comprised of Iridium. In other embodiments, the plurality of alignment features 106 and 108 may be comprised of a different material. The alignment features 106 and 108 do not form a metallurgical bond with one another, and therefore do not need to be fabricated from the same material utilized to fabricate the plurality of conductive bumps 110 and 112. As discussed in more detail below, a plurality of different geometries may be utilized to implement alignment features 106, 108. For example, in some embodiments alignment features 106 includes a plurality of bar-like structures configured to interact or fit within the grooves formed by the plurality of similar bar-like structures (alignment features 108) formed on the opposite die. In some embodiments, alignment features 106 includes a plurality of bar-likes structures with corresponding grooves formed between the bar-like structures, wherein alignment features 108 include any type of geometry (e.g., square, circular, etc.) configured to interact or fit within the grooves formed by the bar-like structures of alignment features 106. In still other embodiments, alignment features 106 is a post-like structure and alignment features 108 is a socket-like structure configured to receive the post-like structure.

In some embodiments, the plurality of conductive bumps 110 are defined by a height $d1$, and the plurality of conductive bumps 112 are defined by a height $d2$. In some embodiments the height $d1$ is approximately equal to the height $d2$. The plurality of alignment features 106 associated with ROIC die 102 are defined by a height $d3$ and the plurality of alignment features associated with the photon detector die 104 are defined by a height $d4$. In some embodiments, the height $d3$ is approximately equal to the height $d4$. In addition, in some embodiments the height $d3$ is greater than the height $d1$. Likewise, the height $d4$ is greater than the height $d2$. During bonding, it is important that the plurality of conductive bumps 110, 112 are brought into contact with one another and allowed to form a metallurgical bond. The heights $d3$ and $d4$ are selected to ensure that conductive bumps 110, 112 are allowed to contact one another and form a metallurgical bond while also aiding in the alignment between the conductive bumps 110, 112. For example, in some embodiments the heights $d3$ and $d4$ are greater than the heights $d1$ and $d2$, but less than approximately twice the height of the conductive bumps 110, 112. This ensures the alignment features 106, 108 come into contact prior to the conductive bumps 110, 112, while also ensuring that the conductive bumps 110, 112 come into contact with one another during bonding. For example, in some embodiments the heights $d1$ and $d2$ are equal to approximately 1 µm and the heights $d3$ and $d4$ are selected to be between 1 µm and 2 µm. As a result, the plurality of alignment features 106 and 108 come into contact with one another prior to conductive bumps 110 and 112. In some embodiments, alignment features 106 and 108 are tapered (e.g., wider at a base end adjacent to the respective die and narrower at a distal end) at the base (i.e., portion located adjacent to the respective die) and narrower at the end to provide a taper to the alignment features. A benefit of this geometry is that during bonding the respective dies do not need to be aligned precisely for the alignment features 106 and 108 to engage. In other embodiments, rather than a taper along the entire sidewall of the alignment features 106, 108, the top portion of the alignment features 106, 108 is beveled to accommodate initial misalignment between the respective features.

In addition, a benefit of the alignment features 106 and 108 having a height greater than the height of conductive bumps 110 and 112 is that the alignment features 106 and 108 will come into contact with one another—at least partially—prior to the conductive bumps 110 and 112 coming into contact with one another. For example, the sidewall 116 of alignment structure 106 may come into contact with the sidewall 118 of alignment structure 108 to encourage alignment prior to the plurality of conductive bumps 110 and 112 coming into contact with one another and ensure alignment after the conductive bumps 110 and 112 are in contact with one another and being pressed together to encourage bonding. This ensures alignment of the conductive bumps 110 and 112 prior to the conductive bumps 110, 112 coming into contact and experiencing bump slip. In addition, bringing the conductive bumps 110, 112 into alignment before contact between the bumps prevents attempts to align the conductive bumps after bonding, which creates an additional force that must be overcome. In addition, as the conductive bumps 110 and 112 are brought into contact and additional force is applied, the alignment features 106 and 108 prevent the conductive bumps 110 and 112 from slipping relative to one another. In some embodiments, if the alignment features 106, 108 do not deform, then the final height of the connection formed through bonding of the conductive bumps 110, 112 is determined by the height of the alignment features 106, 108—assuming that the structures bottom out against the surface of the opposing die. For example, in one embodiment the height $d1$ and $d2$ of conductive bumps 110, 112 are equal to 1.5 µm, and the final thickness of the connection formed by the conductive bumps 110, 112 after compression and bonding is desired to be approximately 1.5 µm, requiring 1.5 µm of compression. To accommodate the anticipated compression, the height $d3$, $d4$ of the alignment features 106, 108 are selected to be equal to 1.5 µm.

Figure 2A:
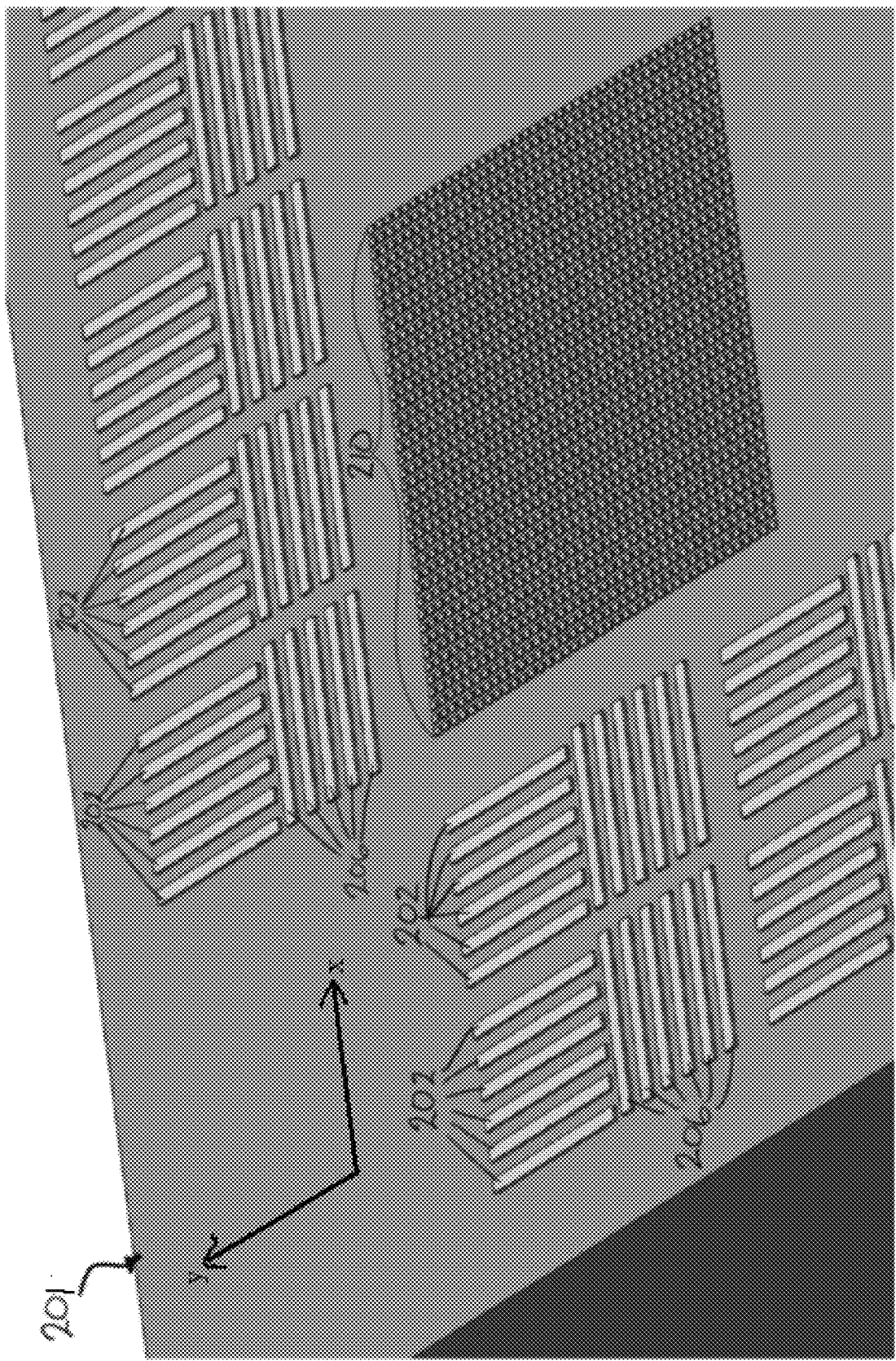
FIG. 2a is an isometric view of alignment structures fabricated on a die according to some embodiments.
Figure 2B:
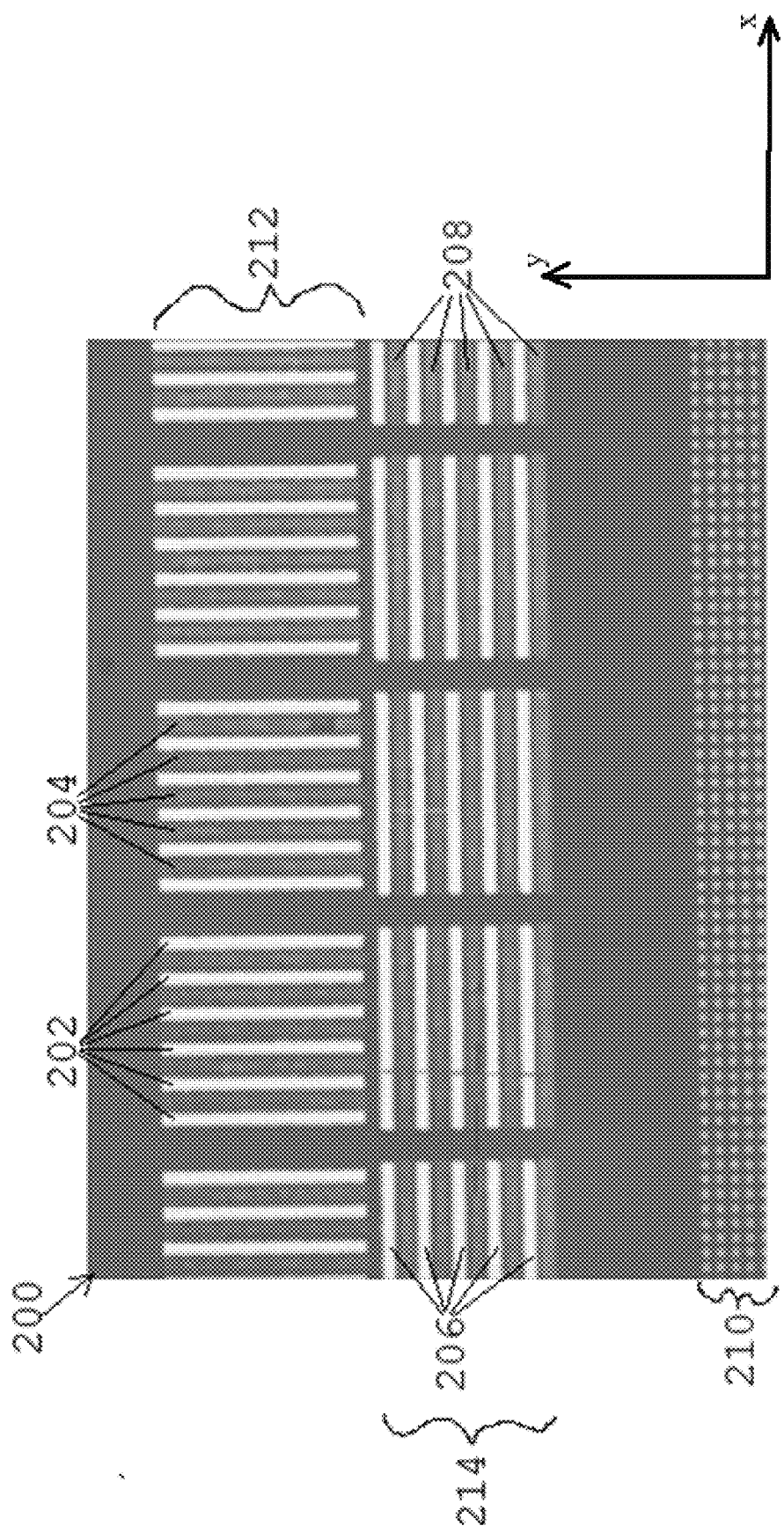
FIG. 2b is a top view illustrating alignment structures utilized to align the ROIC die and the detector die according to some embodiments.
Figure 2C:
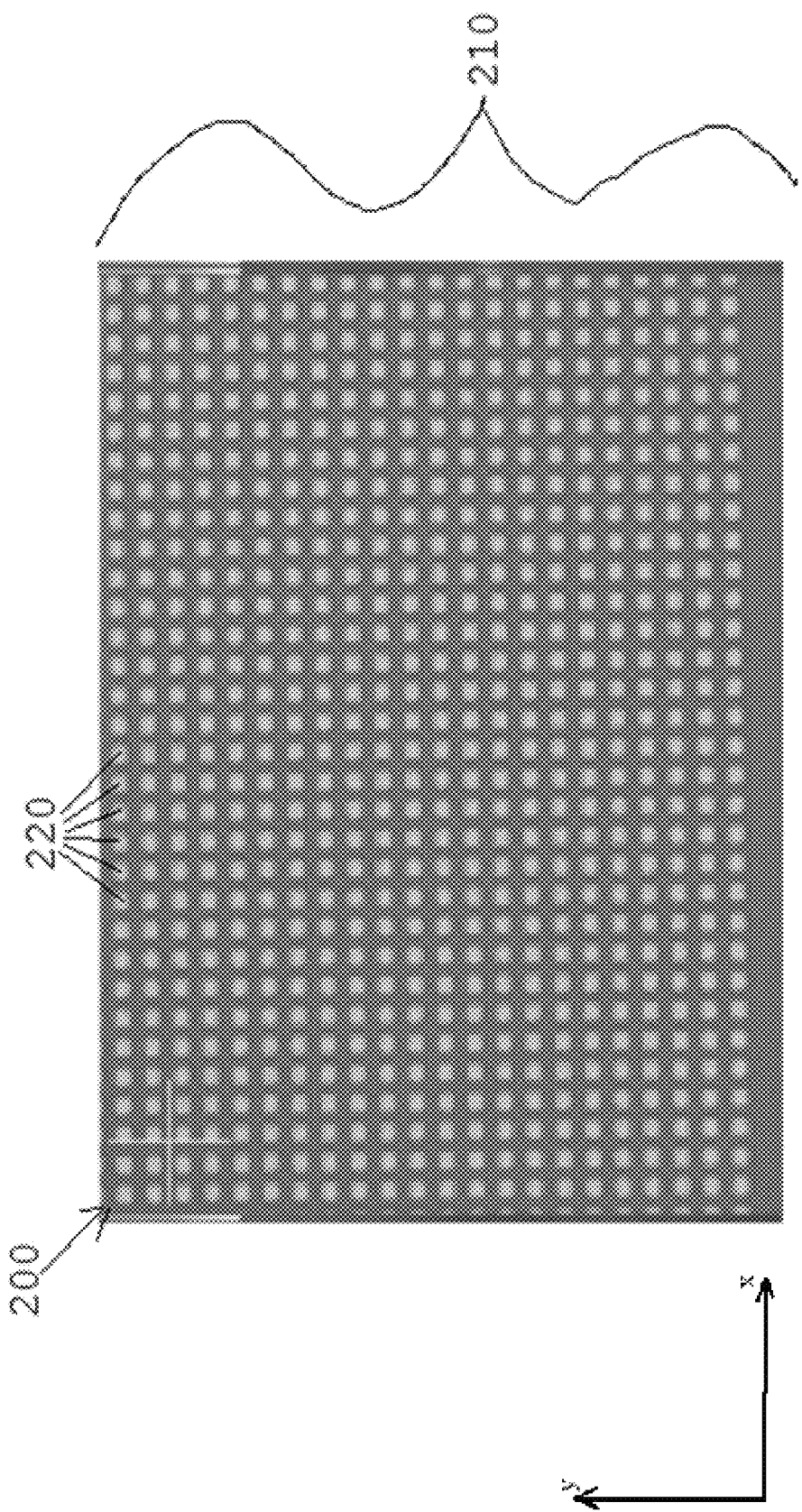
FIG. 2c is a top view illustrating alignment of bumps associated with a hybridized image sensor die according to some embodiments.

FIG. 2a is an isometric view of alignment features fabricated on a die 201 according to some embodiments. FIG. 2b is an optical microscope image (top view) of a portion of hybridized image sensor 200 that includes a plurality of alignment features. FIG. 2c is an optical microscope image of a different portion of the same hybridized image sensor 200 that illustrates the alignment between the plurality of conductive bumps.

With respect to FIG. 2a, a semiconductor die 201 (e.g., photodetector die or ROIC die) includes a plurality of vertical kinematic features 202, a plurality of horizontal kinematic features 206, and a plurality of conductive bumps 210. In the embodiment shown in FIG. 2a, the plurality of vertical kinematic features 202 are bar-like structures extending from a surface of the die 200. Likewise, the plurality of horizontal kinematic features 206 are bar-like structures extending from the surface of die 200. As a result of the plurality of vertical kinematic features 202, a plurality of grooves are formed between the respective bar-like structures 202. As described in more detail with respect to FIGS. 2b and 2c, kinematic features fabricated on the opposite die (e.g., photodetector die or ROIC die) align with the grooves formed between the plurality of vertical kinematic features 202 and likewise between the plurality of horizontal kinematic features 206. The plurality of vertical kinematic features 202 maintain alignment in the horizontal direction (e.g., the direction parallel with the horizontal alignment features 206) and the plurality of horizontal alignment features 206 maintain alignment in the vertical direction (e.g., the direction parallel with the vertical alignment features 202). In this way, the plurality of alignment features act to maintain alignment between the plurality of conductive bumps 210 located on the die 201. Although the embodiment shown in FIG. 2a illustrates a plurality of bar-like structures 202 and 206, in other embodiments a variety of different alignment features may be utilized.

With respect to FIG. 2b, the plurality of alignment features includes a first plurality of vertical alignment features 202, a second plurality of vertical alignment features 204 that interact with the first plurality of vertical alignment features 202, a first plurality of horizontal alignment features 206, and a second plurality of horizontal alignment features 208 that interact with the first plurality of horizontal alignment features 206. The second plurality of vertical alignment features 204 and second plurality of horizontal alignment features 208 are located on the bottom die in this view (could be either the ROIC die or the photon detector die) and as a result the visibility of these structures is reduced as compared to the first plurality of vertical alignment features 202 and first plurality of horizontal alignment features 206. An array of conductive bumps 210 is illustrated in the lower portion of FIG. 2b. Although only a first plurality of conductive bumps associated with one of the dies is visible in this view, a second plurality of conductive bumps would be provided with respect to the other die but obscured due to the alignment between the respective conductive bumps.

As illustrated in FIG. 2b, the first plurality of vertical alignment features 202 are bar-like structures spaced apart from one another to form a plurality of grooves between each vertical alignment structure. For the purposes of this description, the term vertical is utilized to distinguish the first and second plurality of features 202 and 204 from perpendicular features (i.e., horizontal features) 206 and 208. More accurately, the first plurality of vertical alignment features 202 and second plurality of vertical alignment features 204 extend in the y-direction, while the first plurality of horizontal alignment features 206 and the second plurality of horizontal alignment features 208 extend in the x-direction. The x-y plane defines the surface of the respective dies to be bonded together during the hybridization process.

In the embodiment shown in FIG. 2b, vertical alignment features 202 are fabricated in groups of six, with the pattern repeating in the horizontal direction. The second plurality of vertical alignment features 204 are positioned to fit within the grooves defined by the first plurality of vertical alignment features 202. In this example, the second plurality of vertical alignment features 204 are fabricated in groups of five to mirror the five grooves formed between the first plurality of vertical alignment features 202. Although not shown in this view, in some embodiments both the first plurality of vertical alignment features 202 and the second plurality of vertical alignment features 204 have a tapered sidewall geometry that allows for initial mis-alignment between the respective vertical features, wherein the features are brought into alignment as the respective dies are pressed together. Similarly, the first plurality of horizontal alignment features 206 are bar-like structures spaced apart from one another to form a plurality of grooves between each horizontal alignment features. The second plurality of horizontal alignment features 208 are positioned to fit within the grooves defined by the first plurality of horizontal alignment features 206. In this example, the first plurality of horizontal alignment features 206 is fabricated in groups of five, resulting in four grooves being created in space located therebetween. In some embodiments, the second plurality of horizontal alignment features 208 are fabricated in groups of five as well, with four of the horizontal alignment features 208 aligned to fit within the respective horizontal grooves. Once again, in some embodiments both the first plurality of horizontal alignment features 206 and the second plurality of horizontal alignment features 208 have a tapered sidewall geometry that allows for initial mis-alignment between the respective horizontal structures, wherein the structures are brought into alignment as the respective dies are pressed together.

In the embodiment shown in FIG. 2b, vertical alignment features 202, 204 act to align the respective dies in the x-direction and horizontal alignment features 206, 208 act to align the respective dies in the y-direction. In embodiments utilizing an array of pixels extending in both the x direction and the y direction, a combination of vertical and horizontal alignment features may be necessary. In other embodiments, if alignment is only required in one direction (e.g., x-direction), then only one set of alignment features—either horizontal or vertical—may be required.

FIG. 2c is an optical microscope image of a different portion of the same hybridized image sensor 200 that illustrates the alignment between the plurality of conductive bumps 220. In this embodiment, the plurality of conductive bumps 220 are configured in an array 210 that includes a number of rows and a number of columns. In this embodiment, conductive bumps 220 are associated with the top-most die and would be aligned with a plurality of conductive bumps (not visible) located on the bottom die. The microscope image shown in FIG. 2b illustrates the precise alignment between the respective conductive bumps, as only the top-most conductive bumps are visible in this view.

Figure 3:
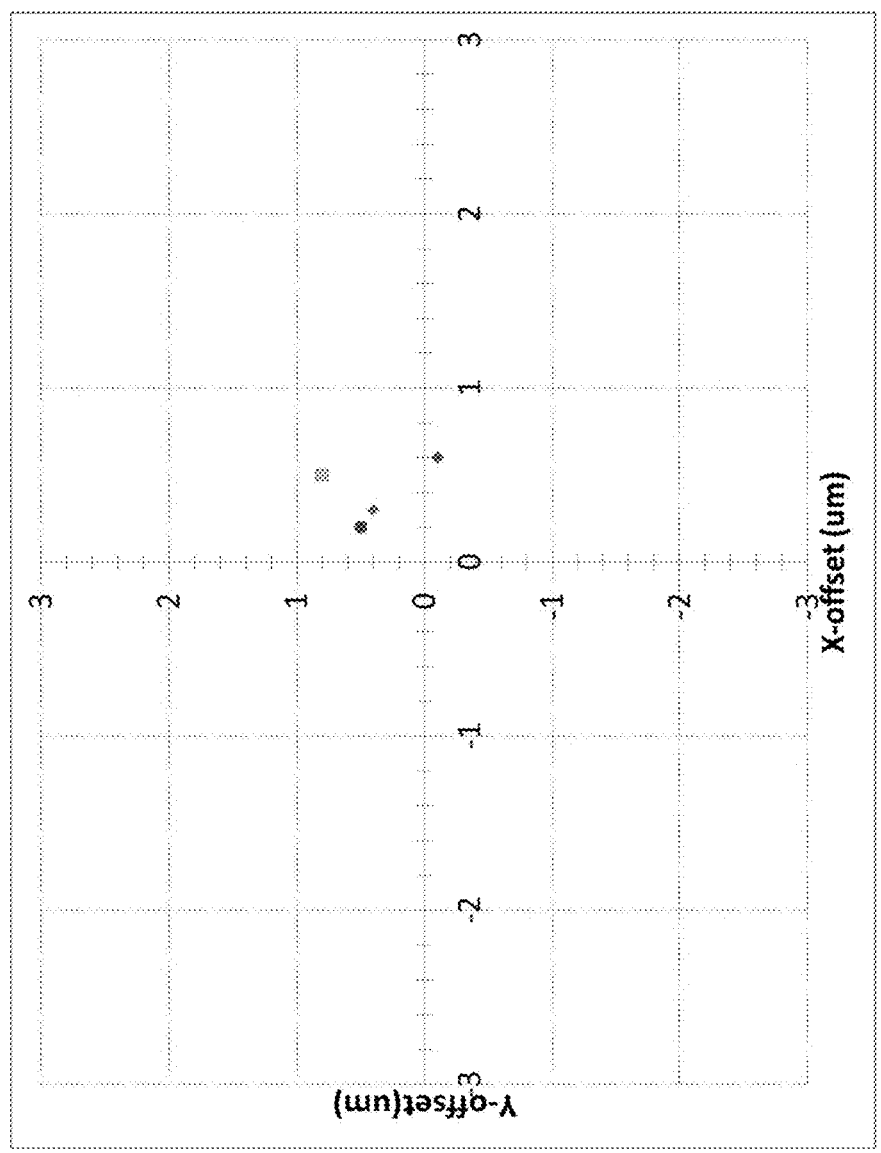
FIG. 3 is a graph that illustrates alignment between bumps associated with a hybridized image sensor die according to some embodiments.

FIG. 3 is a graph that illustrates measured alignment following hybridization using alignment features such as those shown in FIGS. 2a and 2b. In this embodiment, the pitch of the pixels is equal to 5 μm, wherein the dimensions of the conductive bumps are 3 μm by 3 μm in the x-y plane, with a depth or thickness of 1 μm. The graph shown in FIG.

3 illustrates an average offset in the x-direction of 0.36+/−0.18 µm and an average offset in the y-direction of 0.42+/−0.33 µm. The standard deviation of the offset is below 0.5 µm, which illustrates good alignment between the respective conductive bumps.

Figure 4A:
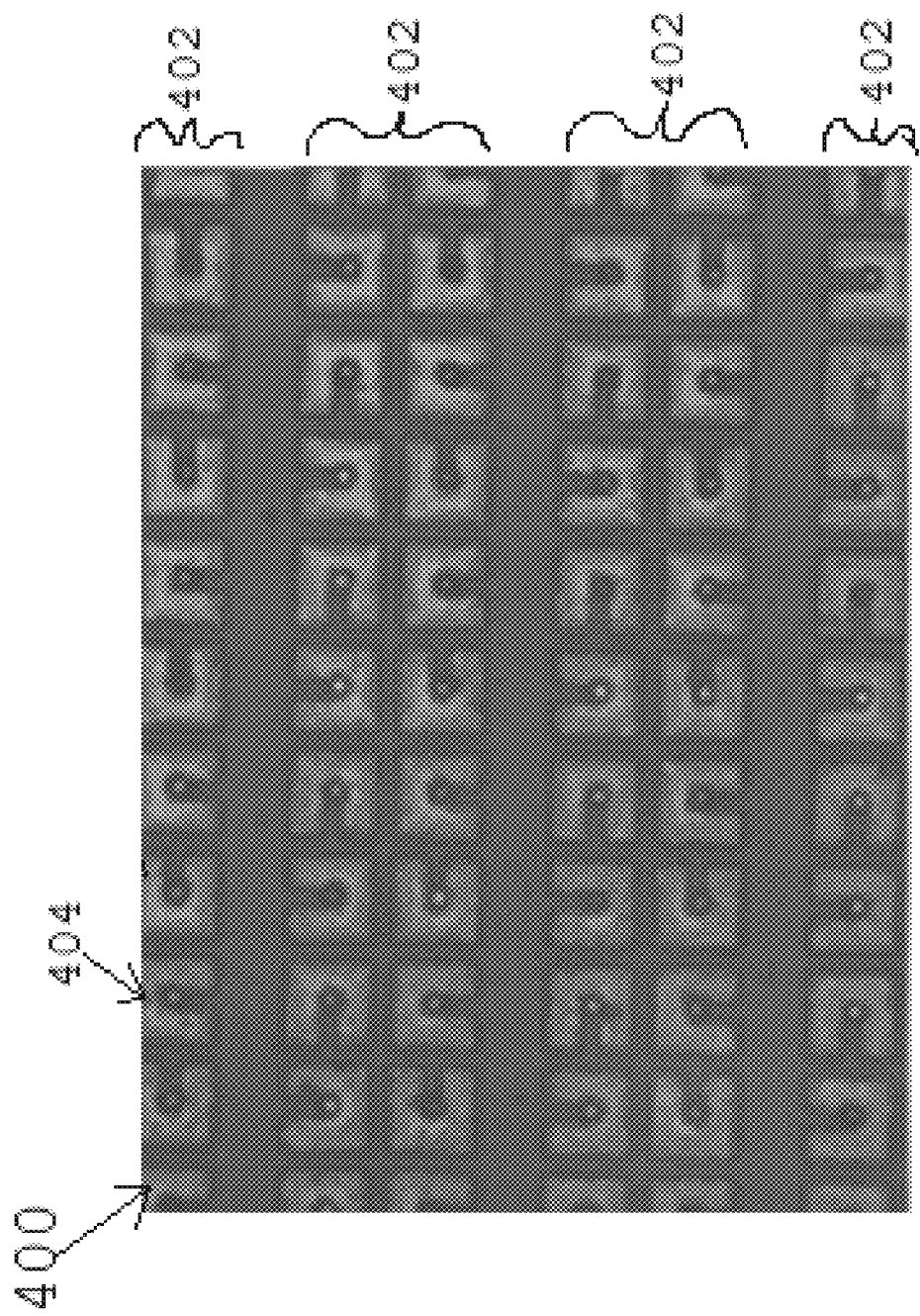
FIG. 4a is a top view illustrating alignment structures according to some embodiments.
Figure 4B:
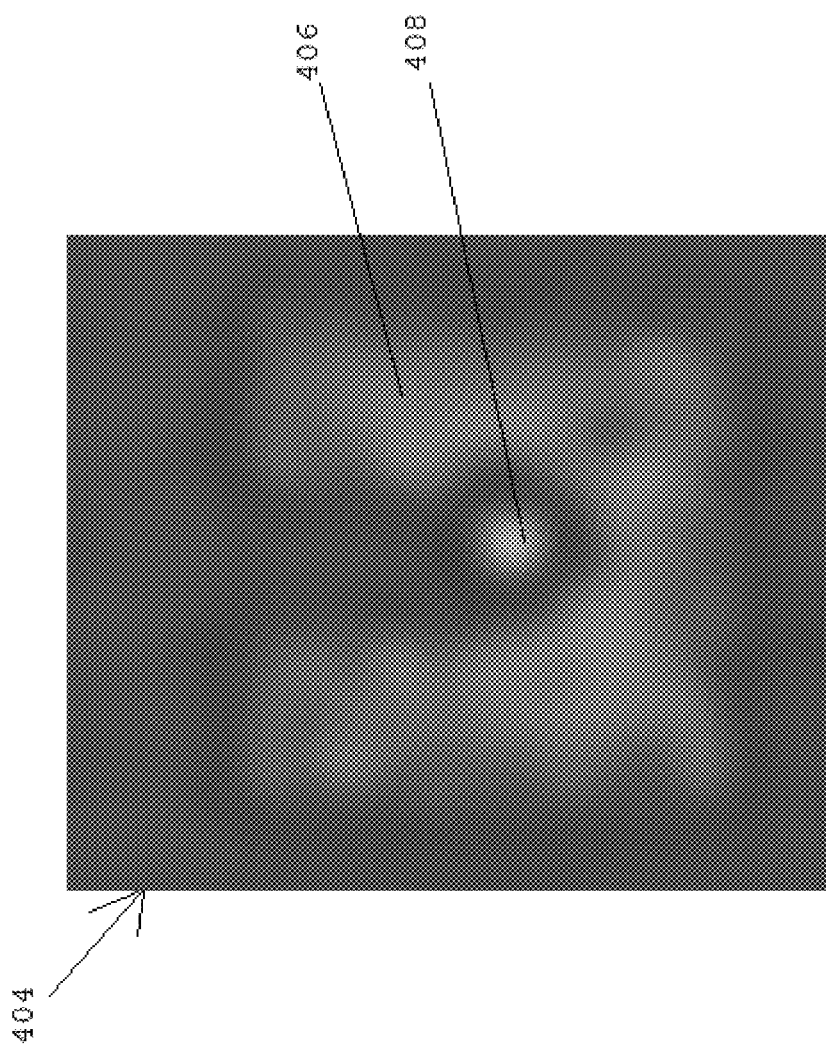
FIG. 4b is a top view illustrating a alignment structure according to some embodiments.

In addition to a plurality of bar-like alignment features shown in FIGS. 2a and 2b, a plurality of other geometries may be utilized to align the conductive bumps associated with the respective dies. For example, FIGS. 4a and 4b are top views illustrating a post and socket alignment features according to some embodiments. FIG. 4a illustrates a plurality of post and socket alignment features 404 extending in both the horizontal and vertical directions. FIG. 4b is a magnified view of one post and socket structure 404. In this embodiment, one of the respective dies is fabricated with a plurality of posts or pillar-like structures 408 that extend away from the surface of the die. The other die includes a plurality of sockets 406 configured to receive the post or pillar-like structure 408. In some embodiments, the socket 406 includes three side walls defining an open region. During hybridization, the pillar-like structures 408 engage with corresponding sockets 406 to promote alignment. In some embodiments, when engaged the pillar-like structure 408 is prevented from moving in three of the possible four directions. For example, in the embodiment shown in FIG. 4b, the pillar-like structure 408 is captured and prevented from moving in three directions. In this embodiment, the pillar-like structure 408 may move in the direction that does not include a sidewall (in the view shown in FIG. 4b, toward the top of the page). As shown in FIG. 4a, the plurality of sockets 406 are rotated such that the open sidewall is located on a different side relative to the plurality of pillar-like structures 408. Although not shown in FIGS. 4a and 4b, in some embodiment the sidewalls of the sockets are tapered to accommodate initial misalignment between the structures. Also not shown in FIGS. 4a and 4b, but the interlocking features—in this case the pillar-like structure 408 and the socket 406—are defined by a height that is greater than the corresponding conductive bumps to ensure that the interlocking features come into contact and provide alignment prior to the conductive bumps coming into contact with one another.

In other embodiments, various other geometries may be utilized with respect to the alignment features. In some embodiments, it may be beneficial that the alignment features are symmetric with one another (e.g., same geometry)—such as that illustrated with the bar-like structures shown in FIGS. 2a and 2b. In other embodiments, the interlocking features may be non-symmetric such as the pillar and socket geometry shown in FIGS. 4a and 4b. However, one of the benefits of the bar-like structure—for example as compared to the post and socket structure—is the length of edges interacting with one another. The greater length of alignment features edges interacting with one another increases the sheer strength of the alignment features (i.e., as the conductive bumps come into contact and require force to further align them, the increase in edge features interacting with one another decreases the likelihood that one or more of the alignment features will sheer).

Figure 5A:
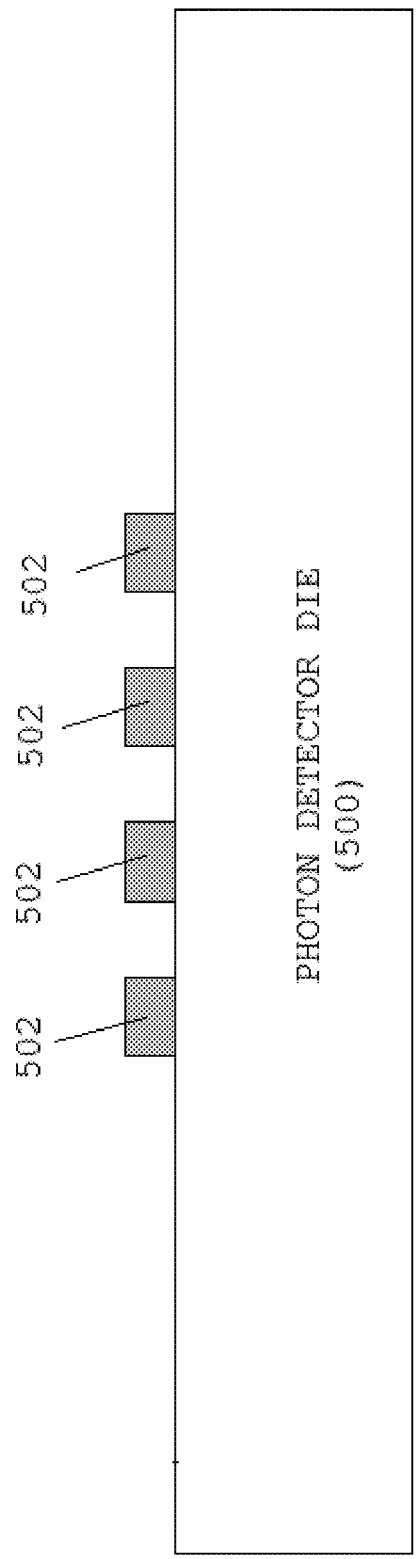
FIGS. 5a-5d are side views illustrating the fabrication, alignment and bonding of hybrid semiconductor dies to form the hybridized image sensor according to some embodiments.

Referring now to FIGS. 5a-5d, a process for fabricating the hybridized image sensor is shown. FIG. 5a illustrates deposition of the conductive bumps 502 on the surface of the photon detector die 500. Although not shown, a similar fabrication step would be utilized to deposit conductive bumps on the surface of the ROIC die. Although only a single die is shown, the process would be repeated on FIG. 4b is a top view illustrating an alignment features according to some embodiments. In some embodiments, conductive bumps 502 are deposited via a lift-off process in which a mask is deposited and patterned, the patterned areas exposing the surface of the die for deposition of the conductive bumps. The conductive material (e.g., Iridium) is deposited via an evaporation process on the surface of the die. After deposition, a lift-off-process is utilized to remove the mask and metal deposited on the mask, leaving the conductive bumps. In other embodiments, conductive bumps may be deposited on the surface of the photon detector die 500 (or ROIC die) via additional well-known processes, including for example electroplating.

Figure 5B:
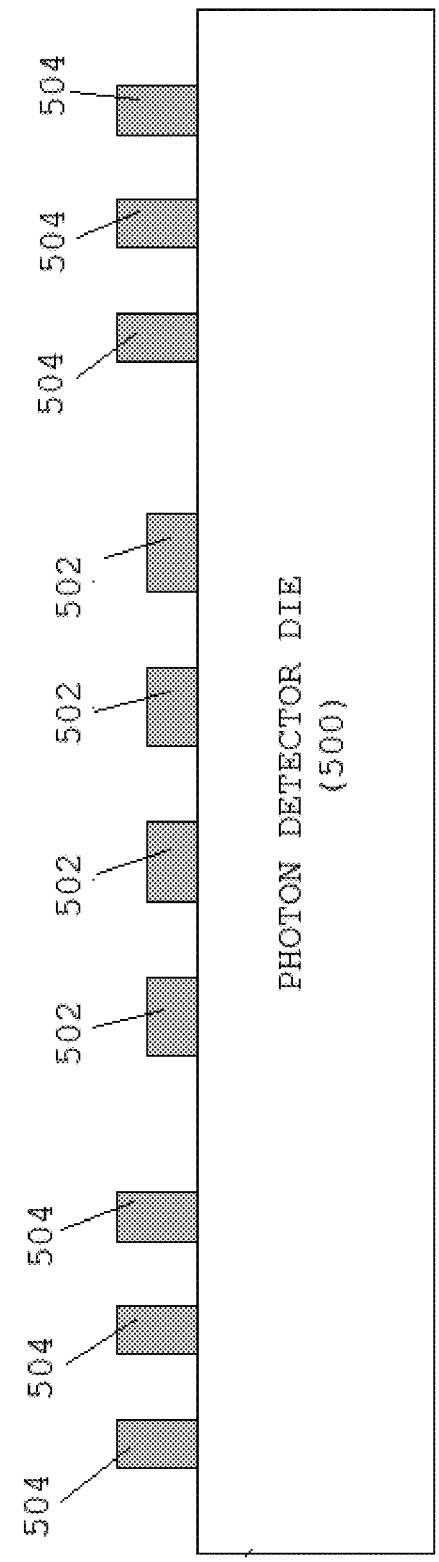

FIG. 5b illustrates deposition of the alignment features 504 on the photon detector die 500. In some embodiments, alignment features 504 are fabricated using a conductive material (e.g., Indium, Gold, Silver, etc.). In some embodiments, a liftoff process—similar to that utilized to fabricate the conductive bumps—is utilized to fabricate the alignment features 504. In other embodiments, alignment features 504 are fabricated using a dielectric material. In some embodiments, a lift-off process may also be utilized to deposit the dielectric material. In other embodiments, the dielectric material may be fabricated using an etch process. In some embodiments, organic structures are defined using photolithography. In the embodiment shown in FIG. 5b, the alignment features 504 have a height that is greater than the height of the conductive bumps 502. Although not shown, a similar process would be implemented with respect to the ROIC die to fabricate the interlocking kinematic features.

Figure 5C:
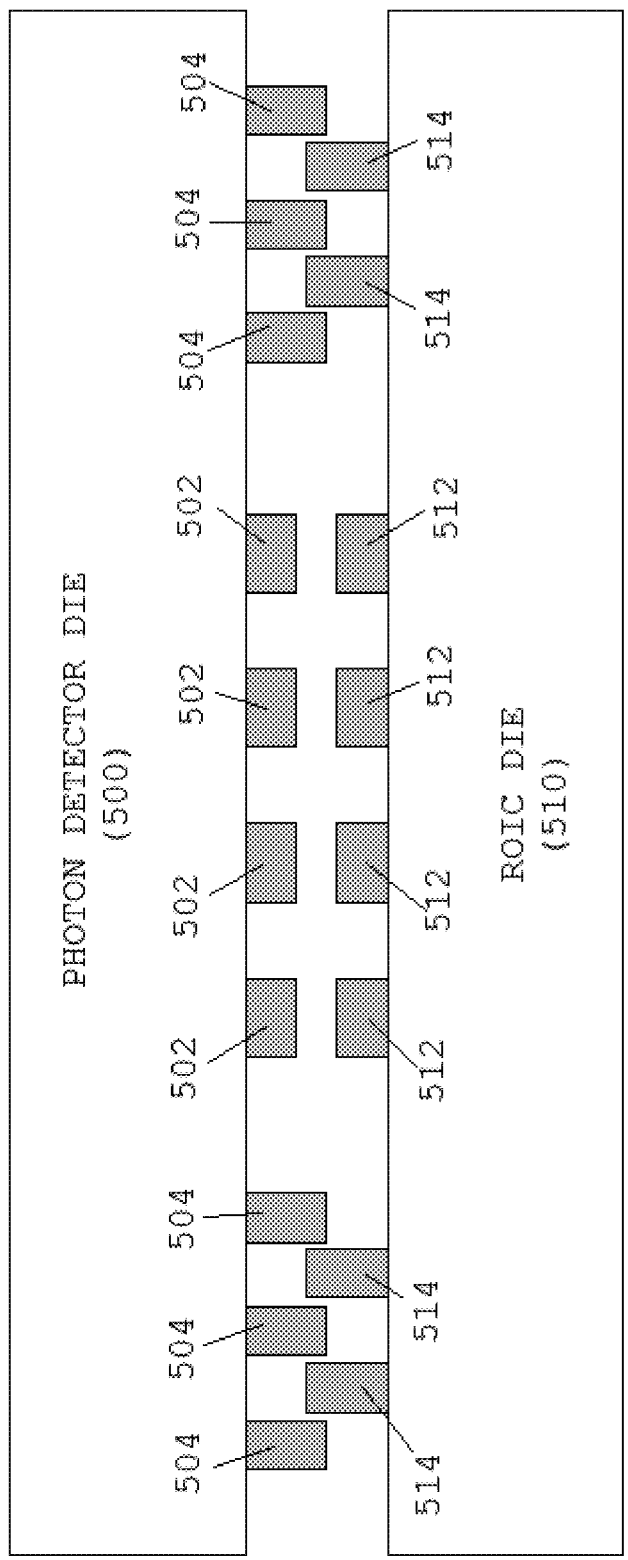

In FIG. 5c, the photon detector die 500 is flipped and at least partially pre-aligned with the ROIC die 510. In the embodiment shown in FIG. 5c, photon detector die 500 includes a plurality of conductive bumps 502 and a plurality of alignment features 504. Likewise, ROIC die 510 includes a plurality of conductive bumps 512 and a plurality of alignment features 514. In particular, the embodiment shown in FIG. 5c illustrates that the height of the plurality of alignment features 504 and 514 is greater than the height of the conductive bumps 500 and 512, and as a result the alignment features 504, 514 begin interacting with one another prior to the conductive bumps 502, 512 coming into contact with one another. As the plurality of alignment features 504, 514 being interacting with one another, the alignment features 504, 514 act to bring the conductive bumps 502, 512 into alignment with one another.

Figure 5D:
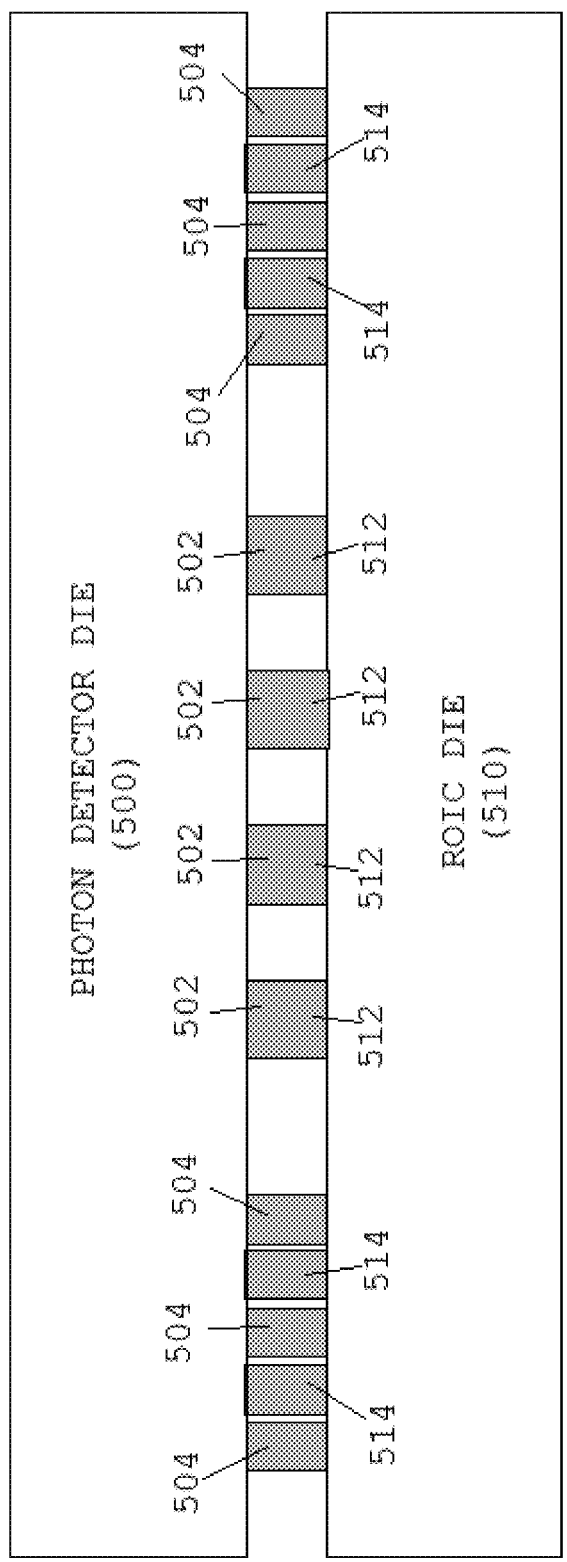

In FIG. 5d, additional force is applied to the photon detector die 500 and the ROIC die 510 to bring the plurality of conductive bumps 502, 512 into contact and to generate a metallurgical bond between the respective conductive bumps 502, 512. In some embodiments, the application of force is significant enough to deform the conductive bumps 502 and 512, causing the conductive bumps 502 and 512 to compress. In some embodiments, the extent to which the conductive bumps 502 and 512 can be compressed is determined by the travel allowed by the alignment features 504, 514. In some embodiments, the conductive bumps 502, 512 deform until the plurality of alignment features 504, 514 bottom out against the surface of the opposite die. For example, alignment features 504 will come into contact or bottom out against the surface of ROIC die 510. Likewise, interlocking feature 514 will come into contact or bottom out against the surface of photon detector die 500. In some embodiments, the height of alignment features 504, 514 ensures that the alignment features are not the limiting factor in the amount of force that may be applied in bonding the respective dies.

Figure 6:
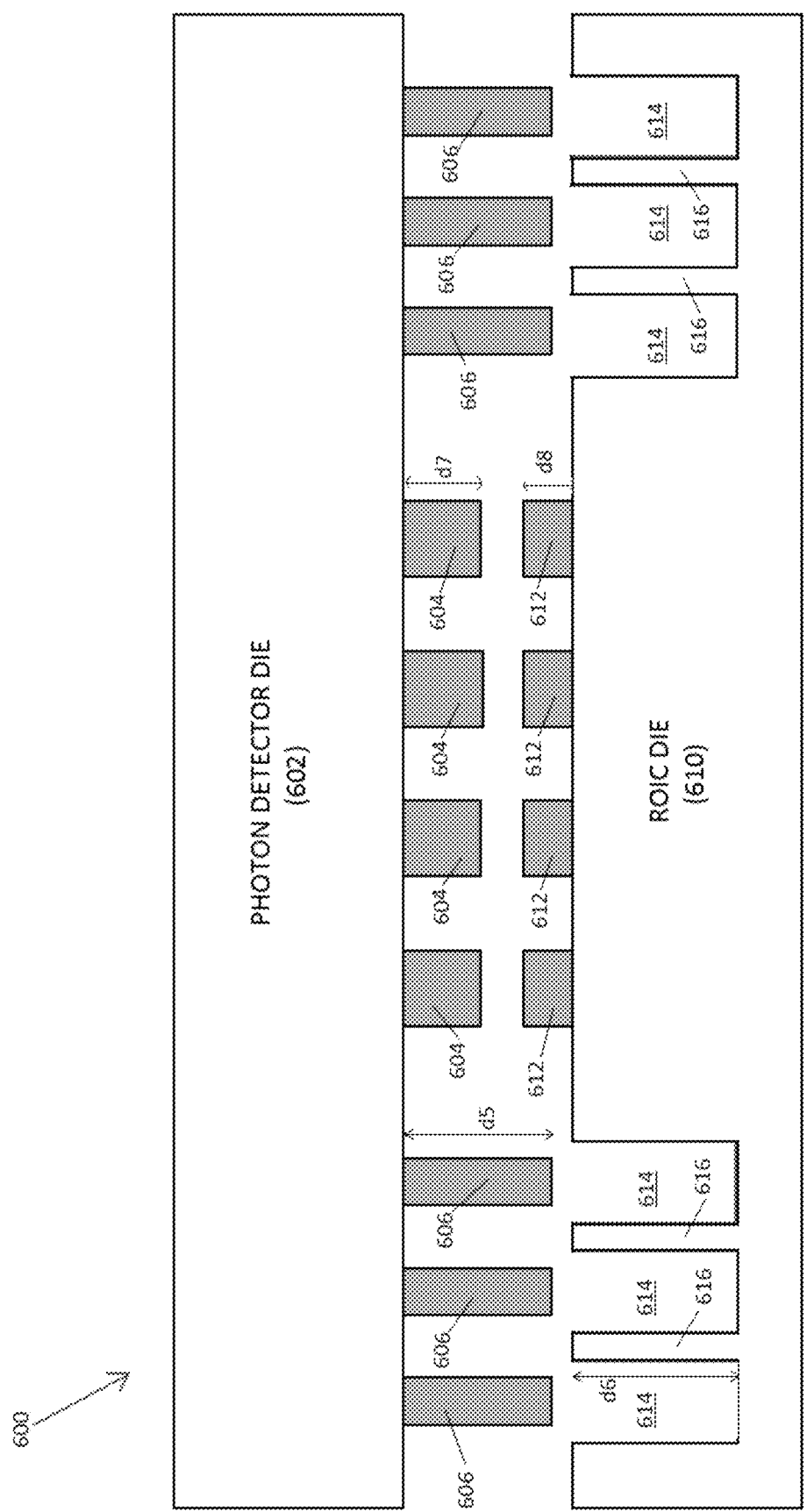
FIG. 6 is a schematic side view of a hybridized image sensor die that includes a silicon readout integrated circuit (ROIC) die and a detector die according to some embodiments.

FIG. 6 is a cross-sectional view of a hybridized image sensor 600 that includes a photon detector die 602 and a silicon readout integrated circuit (ROIC) die 610 prior to bonding. The photon detector die 602 includes a plurality of conductive bumps 604 and alignment features 606. The ROIC die 610 includes a plurality of conductive bumps 612 and alignment features 616. As described above with respect to FIG. 1, the plurality of conductive bumps 604 and 612 are comprised of a conductive material. In some embodiments, the plurality of conductive bumps 604 and 612 are comprised of a material—such as Indium—that allows the conductive bumps 604 and 612 to be bonded at approximately room temperature. In other embodiments, the conductive bumps 604 and 612 may be comprised of other conductive materials, such as gold (Au), copper (Cu), silver (Ag), silver/nickel, etc. but these materials require a higher temperature for metallurgical bonding. In applications in which the photon detector die 602 and ROIC die 610 are dissimilar (e.g., type III-v semiconductor versus silicon substrate) and therefore have different coefficients of thermal expansion, a lower bonding temperature is beneficial. No electrical connection is required between the alignment features 606 and 616 and no metallurgical bonding is required between the features allowing a variety of materials to be utilized. In contrast with previous embodiments in which the interlocking kinematic features are fabricated on the surface of either the photon detector die and/or ROIC die, in the embodiment shown in FIG. 6 alignment feature 606—referred to herein as the male alignment feature—extends from the surface of one of the dies (e.g., photon detector die 602) and may be fabricated using a number of different materials (e.g., dielectric, conductive, polymeric, etc.). In contrast, the alignment features 616—referred to herein as the female alignment feature—is fabricated as the result of formation of one or more grooves 614 within the surface of one of the respective dies (e.g., ROIC die 610). In some embodiments, the remaining material 616 located between the grooves 614 is fabricated utilizing the same material employed by the substrate of the respective die (e.g., ROIC die 610).

In the embodiment shown in FIG. 6, male alignment feature 606 has a height d5 and the female alignment feature 614 is defined by a height d6. In some embodiments, the height d5 of the male alignment feature 606 is approximately equal to the height d6 of the female alignment feature 614. In other embodiments, the height d5 of the male alignment feature 606 is less than the height d6 of the hold 614 to ensure the male alignment feature 606 does not bottom out within the female alignment feature 614.

Conductive bumps 604 are defined by a height d7 and conductive bumps 612 are defined by a height d8. In some embodiments, the height d5 of the interlocking kinematic feature 606 is approximately equal to the sum of heights d7 and d8. In some embodiments, the height d5 of the male alignment feature 606 is greater than the sum of heights d7 and d8 to ensure male alignment feature 606 engages with female alignment feature 614 prior to the plurality of conductive bumps 604 and 612 coming into contact with one another. In this way, the alignment features ensure alignment between the plurality of conductive bumps 604 and 612.

The present disclosure provides a structure and method for aligning conductive bumps in a hybridized image sensor. Alignment is based on the inclusion of a plurality of interlocking kinematic features located on both the photon detector die and the read-out integrated circuit (ROTC) die. The interlocking features are defined by a height that is greater than the height of the conductive bumps being aligned. As a result, during the bonding process, in which one of the dies is flipped over and placed over the other die, the interlocking features come into contact with one another prior to the conductive bumps coming into contact with one another. Contact between the interlocking features urges the respective dies into alignment with one another, bringing the plurality of conductive bumps on both the photon detector die and the ROTC die into alignment as the dies are pressed together.

DISCUSSION OF POSSIBLE EMBODIMENTS

The following are non-exclusive descriptions of possible embodiments of the present invention.

In one aspect, a hybridized image sensor is comprised of a first die having at least a first surface and a second die having at least a second surface. The first die has a first plurality of conductive bumps fabricated on the first surface and a first alignment feature fabricated on the first surface. The second die has a second plurality of conductive bumps fabricated on the second surface and second alignment features fabricated on the second surface. The first alignment features interact with the second alignment features to align the first plurality of conductive bumps with the second plurality of conductive bumps.

The system of the preceding paragraph can optionally include, additionally and/or alternatively any, one or more of the following features, configurations and/or additional components.

For example, the first alignment features may have a height equal to or greater than a height of the first plurality of conductive bumps and wherein the second alignment features may have a height equal to or greater than a height of the second plurality of conductive bumps.

The first alignment feature may be a male alignment feature and the second alignment feature may be a female alignment feature.

The male alignment feature may have a first height greater than or equal to a combined height of the first plurality of conductive bumps and the second plurality of conductive bumps.

The female alignment feature may be defined by a depth of a groove formed in the second surface of the second die, wherein the depth of the groove may be greater than or equal to a height of the male alignment feature.

In some embodiments, one of the first die or the second die is a photon detector die and one of the first die and the second die is a read-out integrated circuit (ROIC) die.

The first alignment features may be comprised of a first plurality of bar-like structures each separated from one another by a distance that defines first grooves.

The second alignment features may be comprised of a second plurality of bar-like structures each separated from one another by a distance that defines second grooves, wherein the first plurality of bar-like structures may be aligned with the second grooves and the second plurality of bar-like structures may be aligned with the first grooves.

The first plurality of bar-like structures may be configured to contact the second surface of the second die and wherein the second plurality of bar-like structures may be configured to contact the first surface of the first die.

The first and second plurality of bar-like structures may have tapered sidewalls.

The first interlocking features may include a first plurality of vertical bar-like structures each separated from one another by a distance that defines first vertical grooves and may further include a second plurality of horizontal bar-like structures each separated from one another by a distance that defines first horizontal grooves.

The second interlocking features may be comprised of a second plurality of vertical bar-like structures each separated from one another by a distance that defines second vertical grooves and may further include a second plurality of horizontal bar-like structures each separated from one another by a distance that defines second horizontal grooves.

The first plurality of vertical bar-like structures may be aligned with the second vertical grooves, the first plurality of horizontal bar-like structures may be aligned with the second horizontal grooves, the second plurality of vertical bar-like structures may be aligned with the first vertical grooves, and the second plurality of horizontal bar-like structures may be aligned with the first horizontal grooves.

The first interlocking features may include a plurality of pillar-like structures and the second interlocking features may include a plurality of socket structures, wherein the socket structures may include a plurality of walls defining a region configured to receive the pillar-like structures.

The plurality of socket structures may include tapered/beveled edges.

The plurality of pillar-like structures may include tapered/beveled edges.

The first and second alignment features may be comprised of conductive materials.

The first and second alignment features may be comprised of dielectric materials.

The first and second alignment features may be comprised of organic materials.

The first and second alignment features may comprise dissimilar materials.

The first plurality of conductive bumps and the second plurality of conductive bumps may comprise Indium.

The height of the first and second alignment features may be less than twice the height of the plurality of conductive bumps.

According to another aspect, a method of fabricating a hybridized image sensor may comprise depositing a first plurality of conductive bumps on a first surface of a first wafer and depositing first alignment features on the first surface of the first wafer. The method may further include depositing a second plurality of conductive bumps on a second surface of a second wafer, and depositing second alignment features on the second surface of the second wafer. The first wafer may then be diced into a plurality of first dies, wherein each first die includes a portion of the first plurality of conductive bumps and a portion of the first alignment features. The photon detector wafer may be diced into a plurality of photon detector dies, wherein each photon detector includes a portion of the second plurality of conductive bumps and a portion of the second alignment features. The method may further include aligning the first surface of a ROIC die with the second surface of a photon detector die, wherein the first alignment features are brought into contact with the second alignment features and then pressing the ROIC die and the photon detector die together, wherein the first alignment features and the second alignment features interact with one another to align the first plurality of conductive bumps with the second plurality of conductive bumps, wherein the first plurality of conductive bumps are bonded with the second plurality of conductive bumps.

The method of the preceding paragraph can optionally include, additionally and/or alternatively any, one or more of the following features, configurations and/or additional steps.

For example, the first and second plurality of conductive bumps may comprise Indium (In).

The interlocking feature may further be comprised of a material selected from the group consisting of a dielectric material, a conductive material, or an organic material.

The invention claimed is:

1. A hybridized image sensor, comprising:
   a first die having a first surface, a first plurality of conductive bumps fabricated directly on the first surface, and a first interlocking feature fabricated directly on the first surface; and
   a second die having a second surface, a second plurality of conductive bumps fabricated directly on the second surface, and second interlocking features fabricated directly on the second surface, wherein the first surface of the first die is facing the second surface of the second die and wherein the first plurality of conductive bumps are vertically aligned to contact the corresponding second plurality of conductive bumps, wherein the first interlocking feature interlock with the second interlocking features, wherein the first plurality of conductive bumps and the second plurality of conductive bumps consist of materials metallurgically bondable at room temperature, wherein a combined height of the first plurality of conductive bumps and second plurality of conductive bumps is less than or equal to at least one of the first interlocking feature and the second interlocking feature;
   wherein at least one of the first plurality of conductive bumps and the second plurality of conductive bumps are deformed in response to an application of the compressive force between the first die and the second die to metallurgically bond the first plurality of conductive bumps to the corresponding second plurality of conductive bumps, and wherein the deformation of at least one of the first plurality of conductive bumps and the second plurality of conductive bumps is limited by a height of at least one of the first interlocking feature and the second interlocking feature.

2. A hybridized image sensor comprising:
   a first die having a first surface, a first plurality of conductive bumps fabricated directly on the first surface, and a first interlocking feature fabricated directly on the first surface; and
   a second die having a second surface, a second plurality of conductive bumps fabricated directly on the second surface, and second interlocking features fabricated directly on the second surface, wherein the first surface of the first die is facing the second surface of the second die and wherein the first plurality of conductive bumps are vertically aligned to contact the corresponding second plurality of conductive bumps, wherein the first interlocking features are positioned on both sides of and interlock with the second interlocking features, wherein the first plurality of conductive bumps and the second plurality of conductive bumps consist of materials metallurgically bondable at room temperature;
   wherein at least one of the first plurality of conductive bumps and the second plurality of conductive bumps are deformed in response to an application of the compressive force between the first die and the second die to metallurgically bond the first plurality of conductive bumps to the corresponding second plurality of conductive bumps, and wherein the deformation of at least one of the first plurality of conductive bumps and the second plurality of conductive bumps is limited by a height of at least one of the first interlocking feature and the second interlocking feature, wherein one of the first die and the second die is a photon detector die and one of the first die and the second die is a read-out integrated circuit (ROIC) die.

3. The hybridized image sensor of claim 1, wherein the first interlocking features are comprised of a first plurality of bar-like structures each separated from one another by a distance that defines first grooves, and wherein the second interlocking features are comprised of a second plurality of bar-like structures each separated from one another by a distance that defines second grooves, wherein the first plurality of bar-like structures are aligned with the second grooves and the second plurality of bar-like structures are aligned with the first grooves.

4. The hybridized image sensor of claim 3, wherein the first plurality of bar-like structures are configured to contact the second surface of the second die and wherein the second plurality of bar-like structures are configured to contact the first surface of the first die.

5. The hybridized image sensor of claim 3, wherein the first and second plurality of bar-like structures each have tapered sidewalls.

6. The hybridized image sensor of claim 1, wherein the first interlocking features are comprised of a first plurality of vertical bar-like structures each separated from one another by a distance that defines first vertical grooves and a second plurality of horizontal bar-like structures each separated from one another by a distance that defines first horizontal grooves, and wherein the second interlocking features are comprised of a second plurality of vertical bar-like structures each separated from one another by a distance that defines second vertical grooves and second plurality of horizontal bar-like structures each separated from one another by a distance that defines second horizontal grooves, wherein the first plurality of vertical bar-like structures are aligned with the second vertical grooves, the first plurality of horizontal bar-like structures are aligned with the second horizontal grooves, the second plurality of vertical bar-like structures are aligned with the first vertical grooves, and the second plurality of horizontal bar-like structures are aligned with the first horizontal grooves.

7. The hybridized image sensor of claim 1, wherein the first and second interlocking features comprise conductive materials.

8. The hybridized image sensor of claim 1, wherein the first and second interlocking features comprise dielectric materials.

9. The hybridized image sensor of claim 1, wherein the first and second interlocking features comprise organic materials.

10. The hybridized image sensor of claim 1, wherein the first and second interlocking features comprise dissimilar materials.

11. The hybridized image sensor of claim 1, wherein the first plurality of conductive bumps and the second plurality of conductive bumps are Indium.

12. The hybridized image sensor of claim 1, wherein the height of each the first interlocking features and the second interlocking features are less than twice the combined height of the first conductive bumps and the second conductive bumps prior to deformation of at least one of the first conductive bumps and the second conductive bumps by the compressive force between the first die and the second die.

13. The hybridized image sensor of claim 1, wherein the first and second interlocking features are not deformed in response to the compressive force utilized to metallurgically bond the first plurality of conductive bumps to the corresponding second plurality of conductive bumps.

14. The hybridized image sensor of claim 13, wherein one or both of the first interlocking feature bottom out against the second die and the second interlocking feature bottoms out against the first die to act as a stop during the application of force between the first die and the second die.

15. The hybridized image sensor of claim 1, wherein both the first plurality of conductive bumps and the second plurality of conductive bumps are deformed in response to an application of a compressive force between the first die and the second die to metallurgically bond the first plurality of conductive bumps to the corresponding second plurality of conductive bumps.

16. A hybridized image sensor comprising:
    a first die having a first surface, a first plurality of conductive bumps fabricated directly on the first surface, and a first interlocking feature fabricated directly on the first surface; and
    a second die having a second surface, a second plurality of conductive bumps fabricated directly on the second surface, and second interlocking features fabricated directly on the second surface, wherein the first surface of the first die is facing the second surface of the second die and wherein the first plurality of conductive bumps are vertically aligned to contact the corresponding second plurality of conductive bumps, wherein the second interlocking features are positioned on both sides of and interlock with the first interlocking features, wherein the first plurality of conductive bumps and the second plurality of conductive bumps consist of materials metallurgically bondable at room temperature;
    wherein at least one of the first plurality of conductive bumps and the second plurality of conductive bumps are deformed in response to an application of the compressive force between the first die and the second die to metallurgically bond the first plurality of conductive bumps to the corresponding second plurality of conductive bumps, and wherein the deformation of at least one of the first plurality of conductive bumps and the second plurality of conductive bumps is limited by a height of at least one of the first interlocking feature and the second interlocking feature, wherein one of the first die and the second die is a photon detector die and one of the first die and the second die is a read-out integrated circuit (ROIC) die.

\* \* \* \* \*